United States Patent
Jung

[11] Patent Number: 5,949,797
[45] Date of Patent: Sep. 7, 1999

[54] MICROCONTROLLER TEST CIRCUIT

[75] Inventor: Kwang-Jae Jung, Seoul, Rep. of Korea

[73] Assignee: Samsung Electronics Co., Ltd., Suwon, Rep. of Korea

[21] Appl. No.: 08/573,969

[22] Filed: Dec. 15, 1995

[30] Foreign Application Priority Data

Dec. 16, 1994 [KR] Rep. of Korea ...................... 94-34589

[51] Int. Cl.[6] .................................................. G06F 11/00
[52] U.S. Cl. .......................................... 371/22.1; 307/39
[58] Field of Search .......................... 371/22.1, 27, 21.1, 371/21.3, 22.5, 25.1, 22.6; 324/158 R, 158.1; 395/183.06; 364/160, 159; 307/29, 37, 39, 115, 139; 326/113

[56] References Cited

U.S. PATENT DOCUMENTS

| | | | |
|---|---|---|---|
| 4,833,395 | 5/1989 | Sasaki et al. | 324/73 R |
| 4,837,505 | 6/1989 | Mitsunobu | 324/158 R |
| 4,970,727 | 11/1990 | Miyawaki et al. | 371/21.3 |
| 5,266,894 | 11/1993 | Takagi et al. | 324/158 R |
| 5,384,741 | 1/1995 | Haraguchi et al. | 365/201 |
| 5,402,063 | 3/1995 | Kim | 324/158.1 |
| 5,410,247 | 4/1995 | Ishizuka | 324/158.1 |
| 5,420,869 | 5/1995 | Hatakeyama | 371/21.1 |

*Primary Examiner*—Robert W. Beausoliel, Jr.
*Assistant Examiner*—Nadeem Iqbal
*Attorney, Agent, or Firm*—Jones & Volentine, L.L.P.

[57] ABSTRACT

A microcontroller test circuit having a plurality of pins includes first circuit for determining whether the microcontroller is in a normal mode or a test mode by sensing the potential of an input test signal; and second circuit for selectively opening a first path for making a first pin of the plurality of pins a signal output pin when the input signal is at a first potential and for opening a second path for making the first pin a test signal input pin when the input signal is at a second potential. In this way, the test circuit uses an existing pin that would not otherwise be used during testing instead of requiring a separate test pin.

4 Claims, 1 Drawing Sheet

MICROCONTROLLER TEST CIRCUIT

BACKGROUND OF THE INVENTION

The present invention relates to a microcontroller test circuit. More particularly, the present invention relates to a microcontroller test circuit that executes its testing function without requiring a separate testing pin, but instead uses an existing pin on the microcontroller.

In general, a microcontroller used in a manufactured device has some user-programmed code installed within it. This code, generally ROM data, controls the general operation of the manufactured device. However, to test whether the code has been properly installed in a microcontroller requires that the microcontroller support a specific test mode different from the microcontroller's general operation mode. Operation in this test mode tests the operational status of the microcontroller.

A conventional microcontroller enters the test mode and performs testing when an input signal of set parameters is applied to a specific pin on the microcontroller. However, since the test pin is unnecessary once testing is complete, its use can undesirably increase the number of pins on the microcontroller. Since an increased the number of pins on a microcontroller leads to increased manufacturing costs, the use of a separate testing pin should be avoided if possible.

SUMMARY OF THE INVENTION

It is therefore an object of the present invention to provide a test circuit of a microcontroller capable of performing a test mode without using a separate test pin.

To achieve the above object of the present invention, a test circuit for a microcontroller having a plurality of pins is provided, the test circuit comprising: first means for determining whether the microcontroller is in a normal mode or a test mode by sensing the potential of an input test signal; and second means for selectively opening a first path for making a first pin of the plurality of pins a signal output pin when the input signal is at a first potential and for opening a second path for making the first pin a test signal input pin when the input signal is at a second potential.

The test circuit may further comprise a gate means connected to the second path, for generating a plurality of test signals in response to the input test signal. The first means in the test circuit may also comprise a plurality of voltage drop components serially connected one another. The second means in the test circuit may comprise a first transmission gate placed on the first path and connected between the first pin and a second pin of the plurality of pins, and a second transmission gate placed on the second path and connected between the first pin and the gate means.

BRIEF DESCRIPTION OF THE DRAWINGS

These and various other features and advantages of the present invention will be readily understood with reference to the following detailed description taken in conjunction with the accompanying drawing, in which.

DETAILED DESCRIPTION OF THE PREFERRED EMBODIMENT

Figure 1:
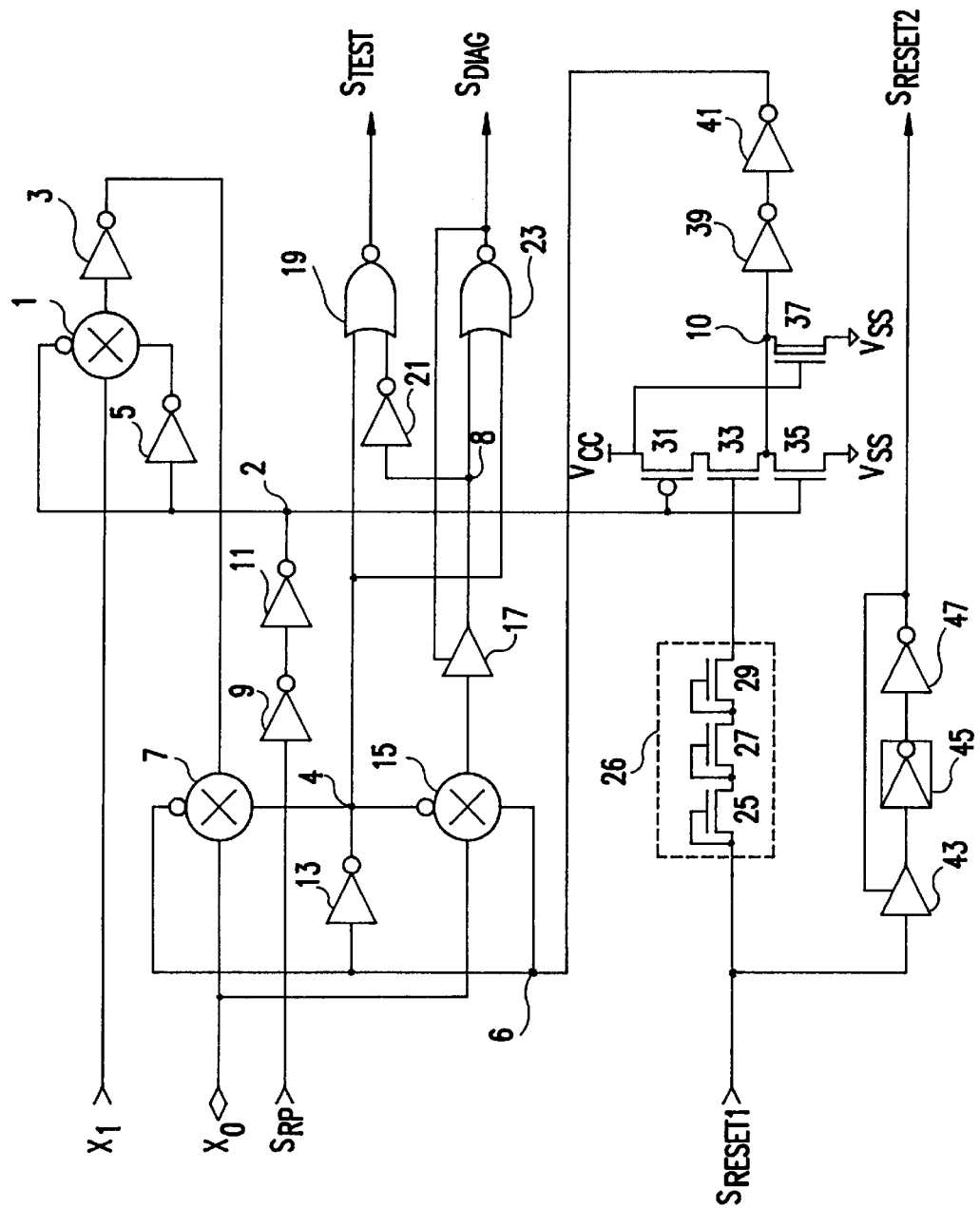
FIG. 1 is a block diagram showing construction of a test circuit according to a preferred embodiment of the present invention.

FIG. 1 shows one construction of a microprocessor test circuit according to a preferred embodiment of the current invention. The microprocessor test circuit of this embodiment can receive input signals at either a bi-directional pin $X_0$ or at an input pin $X_1$. In addition, the microprocessor can generate signals $S_{RP}$ and $S_{RESET1}$ for entering the microprocessor test circuit into a test mode. Furthermore, when in operation, the microprocessor test circuit of this embodiment provides output signals $S_{TEST}$, $S_{DIAG}$, and $S_{RESET2}$.

The pin $X_0$ is preferably a bi-directional pin that operates both in a test mode and in a normal operation mode. In the test mode, the bi-directional pin $X_0$ operates as a signal output pin. In the normal operation mode, the bi-directional pin $X_0$ operates as an input pin. In the preferred embodiment the input pin $X_1$ is a unidirectional pin that operates as an input pin only in the normal operation mode.

The input pin $X_1$ is connected through a first transmission gate 1 to an input terminal of a first inverter 3. The output terminal of the first inverter 3 is then connected through a second transmission gate 7 to the bi-directional pin $X_0$. This allows the bi-directional pin $X_0$ to operate as a signal output mode pin for the signal received at the input pin $X_1$ in a normal operation mode.

In addition to its connection to input pin $X_1$, the bi-directional pin $X_0$ is also connected through a third transmission gate 15 to the input terminal of a first buffer 17. The first buffer 17 provides its output indirectly through a second inverter 21 to an input terminal of a first NOR gate 19 and directly to an input terminal of a second NOR gate 23. The output of the first NOR gate 19 forms the external port input test signal $S_{TEST}$. The output of the second NOR gate 23 forms the diagnostic test mode signal $S_{DIAG}$ and is also connected to a control terminal of the first buffer 17.

The microprocessor internally generates the signal $S_{RP}$ to reduce power consumption by the test circuit. The power reduction signal $S_{RP}$ is applied through serially connected third and fourth inverters 9 and 11 to a signal node 2. The signal node 2 is then directly connected to a P-type electrode of the first transmission gate 1 and is indirectly connected through fifth inverter 5 to an N-type electrode of the first transmission gate 1.

The microcontroller applies a first reset signal $S_{RESET1}$ to a gate of a first NMOS transistor 33 through a test level sensing part 26 comprised of serially connected diode connection type NMOS transistors 25, 27, and 29. The source of the first NMOS transistor 33 is connected to a sensing node 10, and the drain of the first NMOS transistor 33 is connected to the drain of a PMOS transistor 31. The PMOS transistor 31 in turn has its source connected to a power supply voltage Vcc and its gate connected to the signal node 2. A second NMOS transistor 35 is connected between the sensing node 10 and a ground voltage Vss, with its gate also connected to the signal node 2. A depletion type NMOS transistor 37 is also connected between the sensing node 10 and the ground voltage Vss, although its gate is connected to the power supply voltage $V_{cc}$.

The sensing node 10 is attached through serially-connected fifth and sixth inverters 39 and 41 to a P-type control electrode of the second transmission gate 7 and to an N-type control electrode of the third transmission gate 15. The sensing node 10 is also attached through fifth, sixth, and seventh inverters 39, 41, and 13 to an N-type control electrode of the second transmission gate 7, to a P-type control electrode of the third transmission gate 15, and to input terminals of the first and second NOR gates 19 and 23.

The microprocessor test circuit generates a second reset mode signal $S_{RESET2}$ by passing the first reset signal, $S_{RESET1}$ through serially-connected second and third buffers 43 and 45 and through an eighth inverter 47. The second buffer 43 uses the second reset mode signal $S_{RESET2}$ as a control signal for operation.

The preferred embodiment of the microcontroller test circuit of the current invention functions as follows. In normal operation, i.e., not in a test mode, the first reset signal $S_{RESET1}$ is set to a voltage several volts higher than the "low" level voltage, e.g., 5 V, and the power reduction signal $S_{RP}$ is set to a "low" level voltage. Because of the voltage drop across the test level sensing part 26, a signal of logic "low" level results at the gate of the first NMOS transistor 33. This keeps the first NMOS transistor off and sets the potential at the sensing node 10 to a logic "low" level.

A "low" level signal at the sensing node 10, passing through the fifth and sixth inverters 39 and 41, turns on the second transmission gate 7 and turns off the third transmission gate 15. A "low" level signal at the sensing node 10, passing through the fifth, sixth, and seventh inverters 39, 41, and 13, keeps the outputs of the first and second NOR gates 19 and 23 at a "low" level.

During normal operation the signal $S_{RP}$ is kept at a "low" level. This causes a "low" level signal to appear at the P-type electrode of the first transmission gate 1 and "high" level signal to appear at the N-type electrode of the first transmission gate 1. These signals cause the first transmission gate 1 to remain activate while the signal $S_{RP}$ is at a "low" level.

In this normal mode of operation, with the first and second transmission gates 1 and 7 on and the third transmission gate 15 off, the signal applied to the pin $X_1$ is output to the pin $X_0$ through the transmission gates 1 and 7. In other words, in normal operation, the pin $X_0$ serves as a signal output mode pin. At this time the output signals $S_{TEST}$ and $S_{DIAG}$, i.e., the outputs of the NOR gates 19 and 23, are at a "low" level and are therefore in an inactive state.

Thus, in a normal mode, the input pin $X_1$ serves as an input, the pin $X_0$ serves as a signal output pin, the power reduction signal $X_{RP}$ is set at a "low" level voltage, the first reset signal $S_{RESET1}$ is set at several volts above the "low" level voltage, and the output signals $S_{TEST}$ and $S_{DIAG}$ are at a "low" voltage level.

In the test mode, the first reset signal $S_{RESET1}$ is set to a voltage several volts higher than the "high" level voltage, e.g., 12 V, and the power reduction signal $S_{RP}$ is preferably set to a "high" level voltage. Because of the overly high voltage $S_{RESET1}$ signal, the gate of the first NMOS transistor still receives a "high" level voltage despite the voltage drop across the test level sensing part 26. As a result, the first NMOS transistor 33 is turned on and the potential at the sensing node 10 goes to the logic "high" level.

A "high" level signal at the sensing node 10, passing through the fourth and fifth inverters 39 and 41, turns off the second transmission gate 7 and turns on the third transmission gate 15. A "high" level signal at the sensing node 10, passing through the fourth, fifth, and sixth inverters 39, 41, and 13, makes the outputs of the first and second NOR gates 19 and 23 entirely dependent upon the signal at the bi-directional pin $X_0$.

With the second transmission 7 off and the third transmission gate 15 on, signals applied to the pin $X_1$ are cut off, and the bidirectional pin $X_0$ is used as an input mode pin.

Thus, in a normal mode, the input pin $X_1$ is cut off, the bidirectional pin $X_0$ serves as an input mode pin, the first reset signal $S_{RESET1}$ is set at a voltage several volts above the "high" level voltage, and the two output signals $S_{TEST}$ and $S_{DIAG}$ depend entirely upon the signal input at the bidirectional pin $X_0$. In addition, the power reduction signal $X_{RP}$ may be set at a "high" level voltage to turn off the first transmission gate to reduce the power consumption of the circuit during testing.

As described above, the present invention is capable of processing a test signal without using a separate test mode pin, this reduces the number of pins required by the microcontroller and serves to reduce manufacturing cost and complexity.

The present invention is not limited to the above-described embodiment. Various changes and modifications may be effected by one having an ordinary skill in the art within the scope of the invention as, defined by the appended claims.

What is claimed is:

1. A test circuit for a microcontroller having a plurality of pins, the test circuit comprising:

first means for determining whether the microcontroller is in a normal mode or a test mode by sensing the potential of an input test signal; and second means for selectively opening a first path for making a first pin of the plurality of pins a signal output pin when the input signal is at a first potential and for opening a second path for making the first pin a test signal input pin when the input signal is at a second potential.

2. The test circuit of claim 1, wherein the first means comprises a plurality of voltage drop components serially connected to one another.

3. The test circuit of claim 1, further comprising gate means connected to the second path, for generating a plurality of test signals in response to the input test signal.

4. The test circuit of claim 3, wherein the second means comprises a first transmission gate placed on the first path and connected between the first pin and a second pin of the plurality of pins, and a second transmission gate placed on the second path and connected between the first pin and the gate means.

* * * * *